US012068596B2

(12) United States Patent
Molenaar et al.

(10) Patent No.: US 12,068,596 B2
(45) Date of Patent: Aug. 20, 2024

(54) SHORT-CIRCUIT MITIGATION DEVICE

(71) Applicant: COMMONWEALTH SCIENTIFIC AND INDUSTRIAL RESEARCH ORGANISATION, Australian Capital Territory (AU)

(72) Inventors: David Molenaar, Australian Capital Territory (AU); Rueben Rajasingam, Australian Capital Territory (AU); David Marcuson, Australian Capital Territory (AU); Craig Broadly, Australian Capital Territory (AU)

(73) Assignee: COMMONWEALTH SCIENTIFIC AND INDUSTRIAL RESEARCH ORGANISATION, Australian Capital Territory (AU)

( * ) Notice: Subject to any disclaimer, the term of this patent is extended or adjusted under 35 U.S.C. 154(b) by 492 days.

(21) Appl. No.: 17/606,253

(22) PCT Filed: Apr. 24, 2020

(86) PCT No.: PCT/AU2020/050398
§ 371 (c)(1),
(2) Date: Oct. 25, 2021

(87) PCT Pub. No.: WO2020/215127
PCT Pub. Date: Oct. 29, 2020

(65) Prior Publication Data
US 2022/0200263 A1 Jun. 23, 2022

(30) Foreign Application Priority Data
Apr. 24, 2019 (AU) .............................. 2019901395

(51) Int. Cl.
H02H 3/16 (2006.01)
H02H 1/00 (2006.01)

(52) U.S. Cl.
CPC ............ *H02H 3/16* (2013.01); *H02H 1/0007* (2013.01)

(58) Field of Classification Search
CPC .............................. H02H 3/16; H02H 1/0007
See application file for complete search history.

(56) References Cited

U.S. PATENT DOCUMENTS 5,431,796 A 7/1995 Latella
6,316,956 B1 * 11/2001 Oglesbee ......... H03K 19/00392
326/82

(Continued)

FOREIGN PATENT DOCUMENTS

CN 104538949 A 4/2015
JP 2013533390 A 8/2013

(Continued)

OTHER PUBLICATIONS

Australian International-Type Search Report dated Jun. 3, 2019 for Application No. AU 2019901395.

(Continued)

*Primary Examiner* — Rafael O De Leon Domenech
(74) *Attorney, Agent, or Firm* — Ladas & Parry LLP

(57) ABSTRACT

A short-circuit mitigation device for use in an electrolytic cell (101) is disclosed. The device comprises a switch (302) connected in parallel with a damping load (502). The switch is disposed between a contact (102) and an electrode (106) of the cell (101) to selectively provide an electrical conduction path between the contact and the electrode. The switch comprises a plurality of metal-oxide-semiconductor field-effect transistors (MOSFETs) (402) connected in parallel. The device further comprises a switch controller (306) operably associated with the switch (302) to monitor electric current (308) through the switch and to generate a toggle signal (309) to toggle the switch (302) from a conductive (Continued)

closed state to a non-conductive open state when the electric current exceeds a first threshold value.

22 Claims, 14 Drawing Sheets

(56) References Cited

U.S. PATENT DOCUMENTS

| | | | |
|---|---|---|---|
| 6,563,293 B2 * | 5/2003 | Marino | H02M 3/1584 |
| | | | 323/272 |
| 9,255,338 B2 | 2/2016 | Prado | |
| 9,957,628 B2 | 5/2018 | Prado Pueo | |
| 2002/0118495 A1 * | 8/2002 | Beckert | H03K 17/284 |
| | | | 361/2 |
| 2003/0183838 A1 | 10/2003 | Huang et al. | |
| 2003/0183838 A1 | 10/2003 | Huang et al. | |
| 2012/0008246 A1 | 1/2012 | Kim | |
| 2012/0293017 A1 | 11/2012 | Lidsky et al. | |
| 2013/0126337 A1 | 5/2013 | Grant | |
| 2014/0117774 A1 * | 5/2014 | McGill, Sr. | H04B 3/44 |
| | | | 307/112 |
| 2015/0008973 A1 * | 1/2015 | Fukuta | H03K 17/168 |
| | | | 327/379 |
| 2016/0002800 A1 | 1/2016 | Prado | |
| 2017/0256532 A1 | 9/2017 | Lidsky et al. | |
| 2018/0041022 A1 | 2/2018 | Fukui | |

FOREIGN PATENT DOCUMENTS

| | | |
|---|---|---|
| JP | 2016165177 A | 9/2016 |
| JP | 2017511428 A | 4/2017 |

OTHER PUBLICATIONS

International Search Report dated Jun. 22, 2020 for Application No. PCT/AU2020/050398.
Written Opinion dated Jun. 22, 2020 for Application No. PCT/AU2020/050398.
International Preliminary Report on Patentability dated Aug. 18, 2021 for Application No. PCT/AU2020/050398.
First Office Action of Chinese patent application No. 202080042149. X, dated Jul. 28, 2023.
C. Brown et al., "De Nora's Mixed Metal Oxide Anode (MMO) Self-Protected Anode Technology Platform for Metal Electrowinning", 9th International Seminar on Process Hydrometallurgy, ICMSE 2017, 12 pages.
First Office Action of Chilean patent application No. 202102777 by INAPI, mailed Jan. 6, 2023.
Search Report of Chilean patent application No. 202102777 by INAPI, mailed Jan. 6, 2023.
First Office Action of Japanese patent application No. 2021-563089, dated May 7, 2024.

* cited by examiner

SHORT-CIRCUIT MITIGATION DEVICE

CROSS-REFERENCE TO RELATED APPLICATIONS

The present application is an application under 35 U.S.C. 371 of International Application No. PCT/AU2020/050398 filed on Apr. 24, 2020, which claims priority from Australian Provisional Patent Application No 2019901395 filed on 24 Apr. 2019, the entire contents of each of which are incorporated herein by reference in their entirety.

TECHNICAL FIELD

The present disclosure relates to methods and devices for short-circuit mitigation and in particular to methods and devices for short-circuit mitigation in electrolytic cells.

BACKGROUND

State of the art electro-winning (EW) and electro-refining (ER) processes may run at up to 96% current efficiency, however there are a number of current inefficiencies still remaining. Inefficiencies are known to occur due to electrical charges being consumed by alternative reactions, by-passing all reactions due to short-circuiting between anodes and cathodes and stray currents due to electrolyte leaks and salt bridges. Short-circuiting is by far the most frequent cause. Short-circuits result from bent electrodes, improper spacing of electrodes, misaligned electrodes and nodular/dendritic copper growth. A recent survey at a copper electro-refining operation in Australia showed that 2200 short-circuits are identified and corrected per day. Similar numbers are common in other ER and EW tankhouses. The problem has potential for significant impact on productivity if not identified and corrected, accounting for up to 3% of the remaining 4% of cell current inefficiency.

It is usual plant practice to use thermal or gauss meters to identify short-circuits. Once identified, the short-circuits are removed. This is achieved by repositioning misaligned or improperly spaced electrodes, physical removal of nodules, or, in the case of a bent plate, the plate is removed and replaced. In some modern tankhouses that employ fully automated cranes, workers have a very small window of opportunity to detect and correct short-circuits, which further compounds the problem. The process is reactionary and remedial, which consumes significant time and resources.

Attempts to improve identification of short-circuits have been made by both Hatch and Outotec. Both systems work on the principle of the Hall effect to detect changes in current passing through the busbar. The reading is relayed back to the control room to alert the workers in real time to the problem cell or plate. The key benefit is that the time between detection and correction can be reduced, thus improving overall current efficiency. The system, however, is still reactionary and relies on worker intervention to correct the problem. The continued need to have workers on the top of cells correcting short-circuits also reduces the opportunity to fully automate the harvesting process.

The discussion of the background to the disclosure is intended to facilitate an understanding of the disclosure. However, it should be appreciated that the discussion is not an acknowledgement or admission that any of the material referred to was published, known or part of the common general knowledge as at the priority date of the application.

SUMMARY

According to a first aspect, there is provided a short-circuit mitigation device for use in an electrolytic cell having an electrical contact and an electrode, the device comprising:
a switch connected in parallel with a damping load and disposed between the contact and the electrode, the switch configured to selectively provide an electrical conduction path between the contact and the electrode, wherein the switch comprises a plurality of metal-oxide-semiconductor field-effect transistors (MOSFETs) connected in parallel;
a conductive failsafe path connected in parallel with the MOSFETs to provide an electrical path around the switch; and
a switch controller operably associated with the switch to monitor electric current through the switch and to generate a toggle signal to toggle the switch from a conductive closed state to a non-conductive open state when the electric current exceeds a first threshold value.

It is an advantage of this aspect that a switch can be disposed in-line, between the contact and the electrode, to provide an electrical conduction path. This allows the switch to directly control the current to the electrode, allowing for automatic current control to an individual electrode and mitigate the onset of the problematic short from occurring. The plurality of MOSFETs connected in parallel allow for an increased electrical current capacity over a single MOSFET device as well as a reduced electrical resistance.

The failsafe path may include a conductor having an electrical resistance greater than the electrical resistance of the plurality of MOSFETS in its closed conducting state.

The switch controller may monitor current through the switch by measuring a voltage drop across the MOSFETs.

It is advantageous to monitor the current through the switch by measuring a voltage drop across the MOSFETs as this configuration avoids the need for a shunt resistor which would consume power.

The switch controller may monitor current through the switch by comparing the voltage drop across the MOSFETs to a predetermined model of the MOSFETs, wherein the model relates electrical resistance of the MOSFETs to the temperature of the MOSFETs.

The controller may be further configured to operate in at least a first mode of operation and a second mode of operation wherein the first mode of operation has a first threshold value and the second mode of operation has a second threshold value.

It is an advantage of this embodiment that the switch can operate in different modes, allowing the switch to adapt its operation. This is beneficial as current distribution across the electrolytic cell varies depending on the phase of operation of the cell.

The controller may be configured to generate the toggle signal when the electric current through the switch exceeds the first or second threshold value for a predetermined period of time.

The controller may be configured to transmit data indicative of the electric current.

The controller may be configured to transmit state data indicative of the state of the switch.

The controller may be configured to adopt a mode of operation in response to a received configuration signal.

The configuration signal may be state data received from a second controller of a second device.

The configuration signal may be received from a cell controller.

The cell controller may be in two way communication with a plurality of controllers and generates the configuration signal in response to state data respectively received from each of the plurality of controllers.

The controller may be configured to adopt a low power state at predetermined times such that in the low power state the controller does not monitor the electric current through the switch.

The controller may be configured to generate a reset signal to toggle the switch from the non-conductive open state to the conductive closed state.

The controller may be configured to control the time averaged current through the switch.

The controller may be configured to control the time averaged current through the switch by cyclically generating a further signal to toggle the switch between the non-conductive open state for an open time period and the conductive closed state for a closed time period such that the time averaged current is determined by the relative open and closed time periods.

The switch may comprise one or more solid state switching devices.

The one or more solid state switching devices may be selected from MOSFET, transistor, triac, thyristor, Darlington pair and solid state relay.

The device may comprise:
a top contact to support the electrode;
a bottom contact to rest on the electrical contact and separated from the top contact by an electrically insulating layer;
wherein a first end of the switch electrically contacts the top contact and a second end of the switch electrically contacts the bottom contact and wherein the switch is displaced from the top and bottom contacts.

The electrolytic cell may be an electrowinning cell or an electrorefining cell or an electrodeposition cell.

The first threshold current may be a predetermined first multiple of a normal working current.

The first multiple may be from 1.5 to 3.

The second threshold current may be a predetermined second multiple of a normal working current.

The second multiple may be from 2 to 3.5.

According to a second aspect, there is provided a system comprising two or more devices as described above.

According to a third aspect, there is provided a method performed by a short-circuit mitigation device having a switch connected in parallel with a conductive failsafe path to provide an electrical path around the switch, the switch comprising a plurality of metal-oxide-semiconductor field-effect transistors (MOSFETs) connected in parallel and disposed between an electrical contact and an electrode in an electrolytic cell, the method comprising:
receiving a current signal indicative of an electrical current through the switch; and
generating a toggle signal to toggle the switch from a conductive closed state to a non-conductive open state when the current signal is indicative that the electric current exceeds a first or second threshold value.

BRIEF DESCRIPTION OF DRAWINGS

Notwithstanding any other forms which may fall within the scope of the process as set forth in the Summary, specific embodiments will now be described with reference to the accompanying figures below.

DESCRIPTION OF EMBODIMENTS

The disclosure relates to devices, methods and systems to mitigate short-circuits in an electrolytic cell. In particular the disclosure relates to a device for detecting short-circuits in an electrolytic cell and for automatically, electrically isolating an electrode or controlling the current to it.

Unless explicitly stated or required by context, the terms electrical contact, contact, busbar and bus are used interchangeably and are intended to have equivalent scope.

Short-Circuit Mitigation Device for Use in Electrolytic Cells

Figure 1:
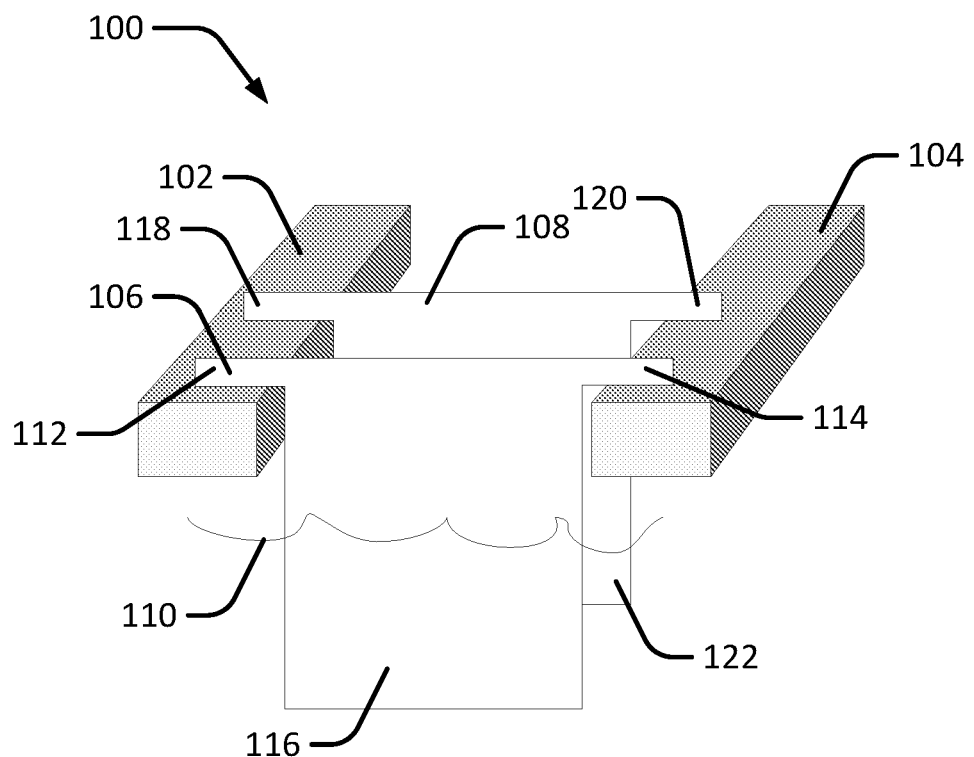
FIG. 1 is an isometric view of an exemplary electrolytic cell.

FIG. 1 illustrates a typical electrolytic cell 100 for use in electrorefining, electrowinning or electrodeposition. Cell 100 comprises a cathode busbar 102, anode busbar 104, a conductive cathode plate 106 and a conductive anode plate 108. Plates 106 and 108 electrically contact cathode busbar 102 and anode busbar 104 respectively such that busbars 102 and 104 act as electrical contacts for plates 106 and 108 respectively. Cell 100 further comprises an electrolytic solution 110.

Cathode plate 106 is suspended from cathode busbar 102 and anode busbar 104 by support wings 112 and 114 such that a lower portion 116 of plate 106 is submerged in solution 110. Plate 106 is electrically connected to cathode busbar 102 only and is electrically isolated from anode busbar 104 by an insulating insert (not shown) between support wing 114 and anode busbar 104. Accordingly, plate 106 and specifically portion 116 acts as a cathode electrode in cell 100.

Similarly, anode plate 108 is suspended from busbars 102 and 104 by support wings 118 and 120 such that a lower portion 122 of plate 108 is submerged in solution 110. Plate 108 is electrically connected to anode busbar 104 only and is electrically isolated from cathode busbar 102 by an insulating insert (not shown) between support wing 118 and cathode busbar 102. Accordingly, plate 108 and specifically portion 122 acts as an anode electrode in cell 100.

Figure 2:
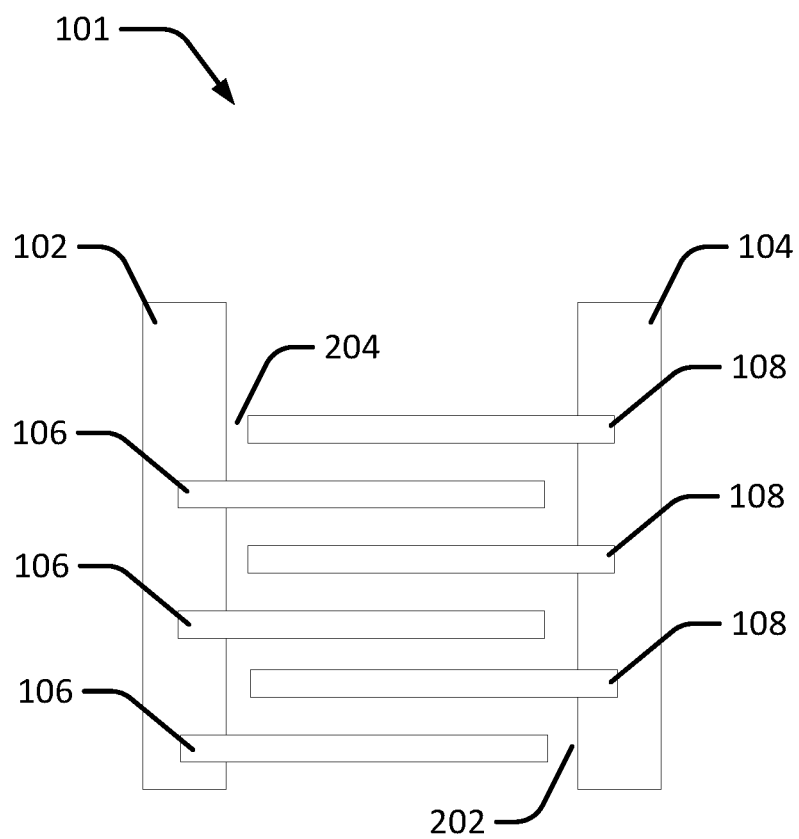
FIG. 2 is a top view of an exemplary electrolytic cell.

FIG. 2 illustrates a top view of an electrolytic cell 101. Cell 101 is similar in design to cell 100 but includes a plurality of cathodes 106 interdigitated with anodes 108. The top view illustrates the electrical contact between the cathodes 106 and cathode busbar 102 and the lack of electrical contact with anode busbar 104 with gap 202. In practice gap 202 may comprise a solid insulating material connecting to both cathode plate 106 and anode busbar 104. Similarly, anode electrodes 108 are in electrical contact with anode busbar 104 and isolated from cathode busbar 102 by gap 204 which in practice may comprise a solid insulating material connecting to both anode plate 108 and cathode busbar 102.

In operation, cells 100 and 101 conduct electric charge between cathode electrodes 106 and adjacent anode electrodes 108 through electrolyte 110. Short-circuits frequently occur as a result of bending of electrodes 106 and/or 108, misalignment of electrodes 106 and/or 108 and/or dendritic growth of metal deposited on cathode electrode(s) 106.

As mentioned above, existing methods for detecting short-circuits involve thermal imaging devices or Gauss meters. During a short-circuit, abnormally large electric currents flow through the electrodes involved in the short-circuit causing these electrodes to increase in temperature. Thermal imaging devices detect short-circuits by helping to identify electrodes with an increased temperature, while Gauss meters/Hall effect sensors detect the increased current via an associated increase in magnetic field.

When a short-circuit is detected, a worker may have to manually remove the electrodes involved to investigate the cause of the short-circuit. The worker may be able to mitigate the short-circuit by removing dendritic metal deposits or repositioning the electrodes. Failing this, the relevant electrode(s) will have to be removed and replaced. The presence of workers on top of the electrolytic cells restricts the use of automated devices for harvesting cathode electrodes. Furthermore, worker activity can disturb the plates, resulting in the formation of new short-circuits.

Figure 3:
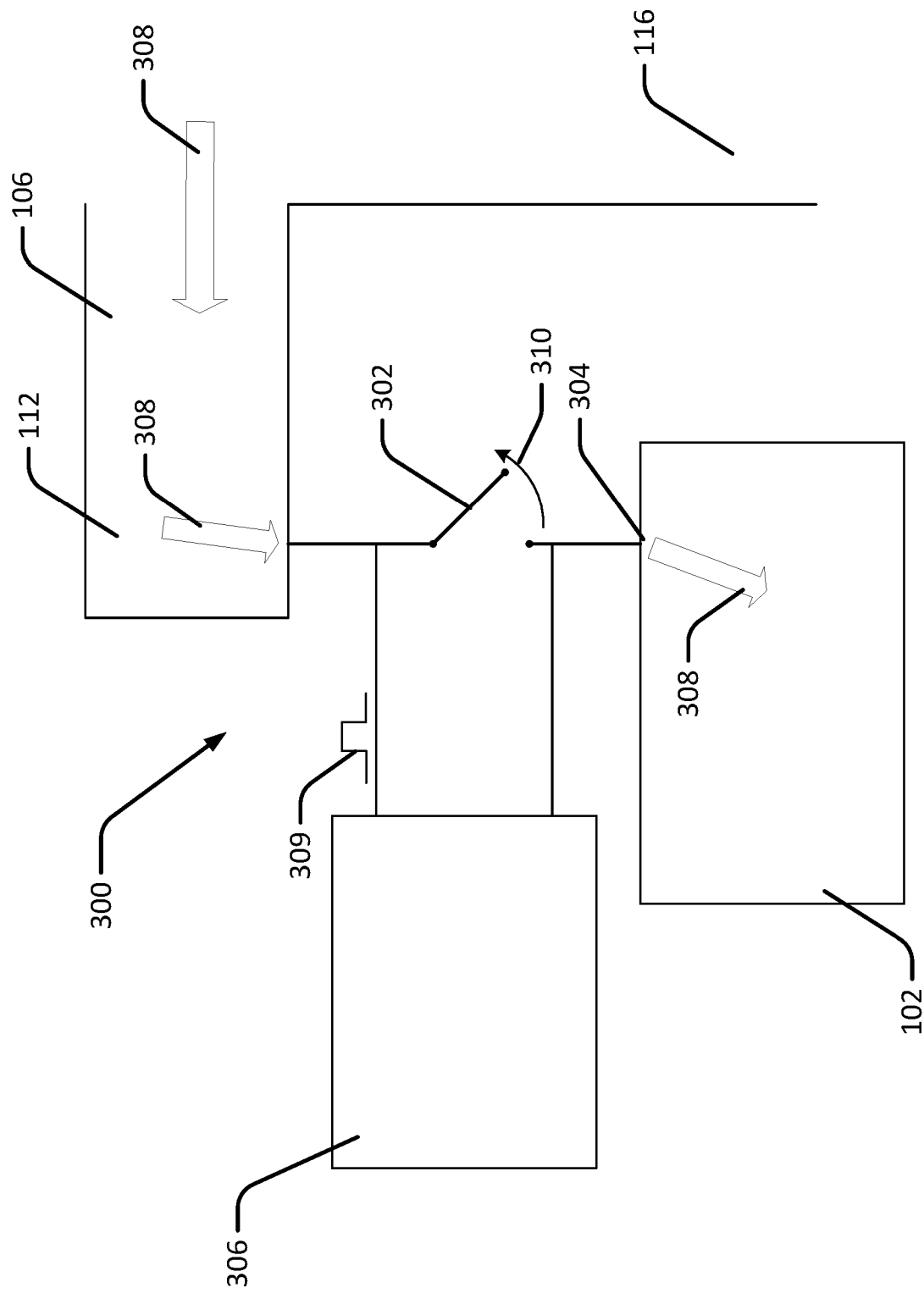
FIG. 3 is a schematic representation of a short-circuit mitigation device.

FIG. 3 is a schematic illustration of a short-circuit mitigation device 300 for use in an electrolytic cell such as cell 100 or 101. Device 300 comprises an in-line switch 302 disposed between electrical contact 304 of inter-cell busbar 102 and cathode electrode 116 of cathode plate 106 with support wing 112. Device 300 further comprises a switch controller 306 operably associated with switch 302. Controller 306 monitors electric current 308 through switch 302 and generates a toggle signal 309 when current 308 exceeds a first threshold value. Toggle signal 309 toggles switch 302 from a conductive closed state to a shown non-conductive open state as indicated by arrow 310.

The first threshold value is an electric current magnitude indicative of a near short-circuit condition in electrolytic cell 100 or 101 and will be application specific. In some embodiments, the first threshold is a predetermined first multiple of a normal operating current. For example a first threshold value of double the normal operating current may be used. In this case, if the current flowing through switch 302 reaches or exceeds twice the value of normal operating conditions, controller 306 toggles switch 302 from the conductive closed state to the non-conductive open state. In the non-conductive open state, no appreciable electric current flows through switch 302 and consequently electrode 116 becomes electrically isolated, insulated or disconnected from electrical contact 304 of cathode busbar 102. For example if the normal operating current is 620 amperes, the first threshold current will be about 1240 amperes. Thus, when current 308 reaches or exceeds 1240 amperes, controller 306 toggles switch 302 from the conductive closed state to the non-conductive open state as indicated by arrow 310. It will be appreciated that in some embodiments of switch 302, an insignificant residual current may flow through switch 302 when in the non-conductive open state.

In some embodiments controller 306 monitors electric current 308 through switch 302 by measuring a voltage drop across switch 302. The voltage drop may be converted to an electric current value by controller 306 using known electrical characteristics of switch 302 to derive an accurate indication of current 308. The electrical characteristics comprise the electrical resistance of switch 302 as a function of temperature. For example, in some embodiments, switch 302 comprises a plurality of metal-oxide-semiconductor field-effect transistors (MOSFETs) connected in parallel (discussed in detail below). In this case, controller 306 can measure the voltage drop across the MOSFETs and use it to determine a current through the MOSFETs by using known electrical properties of the MOSFETs. The determination process may include applying a temperature correction to the electrical properties of the MOSFETs before determining the current.

By using the voltage drop across switch 302 to determine electric current through switch 302, no shunt resistor is required. Accordingly, the power efficiency of switch 302 is improved as there is no power consumed in a shunt resistor.

In some embodiments, controller 306 generates toggle signal 309 when the rate of change of current 308 through switch 302 exceeds a first threshold value. By utilising the rate of change of current, controller 306 is able to determine whether conditions for the creation of a short-circuit are present, also referred to as a 'soft short'. When these conditions are present, the generation of toggle signal 309 causes switch 302 to toggle to the non-conductive open-state, effectively stopping current 308. This action pre-empts short-circuits and prevents them from forming.

It can be considered that device 300 detects the onset and/or presence of short-circuits and mitigates the effects of these short-circuits by controlling current through device 300.

Exemplary Switch

Switch 302 may comprise any suitable switching device. For example, switch 302 may comprise one or more solid state switching devices selected from MOSFET, transistor, triac, thyristor, Darlington pair and solid state relay. An embodiment of switch 302 is described in greater detail below, with reference to FIG. 4.

Figure 4:
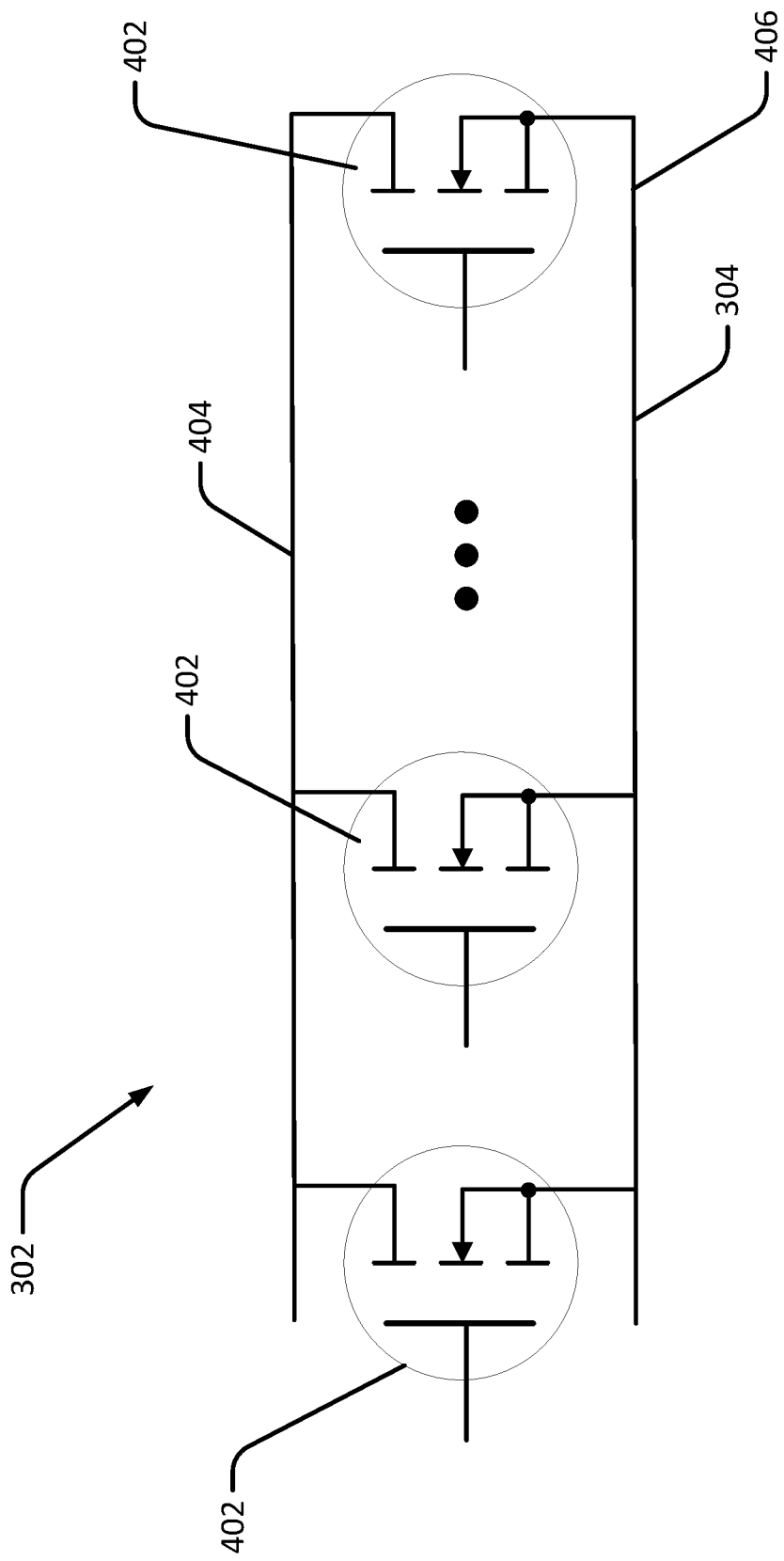
FIG. 4 illustrates an embodiment of the switch of FIG. 3.

As mentioned above, switch 302 may comprise one or more solid state switching devices. FIG. 4 illustrates one such exemplary embodiment, where switch 302 comprises a plurality of MOSFET devices 402 connected in parallel. Switch 302 has a drain 404 side and a source 406 side. In practice, drain side 404 connects to electrode 116 and source 406 side connects to electrical contact 304 of cathode busbar 102 for n-channel MOSFETs.

By connecting the plurality of MOSFETs 402 in parallel, the electrical current capacity of switch 302 can be significantly increased over the capacity of a single MOSFET. Furthermore, the electrical resistance of switch 302 can be significantly reduced in comparison to a single solid state switching device such as a thyristor or a single MOSFET (with a higher current capacity). For example, a single MOSFET with a current capacity of 500 amps will typically have a resistance of 1-20 milliohms. In comparison, fifteen MOSFETs connected in parallel, with each MOSFET having a current capacity of 40 amps could conduct the 500 amps with a resistance of 13 microohms. Thus, by connecting the MOSFETs in parallel, the resistance can be reduced by around two to three orders of magnitude.

Figure 5A:
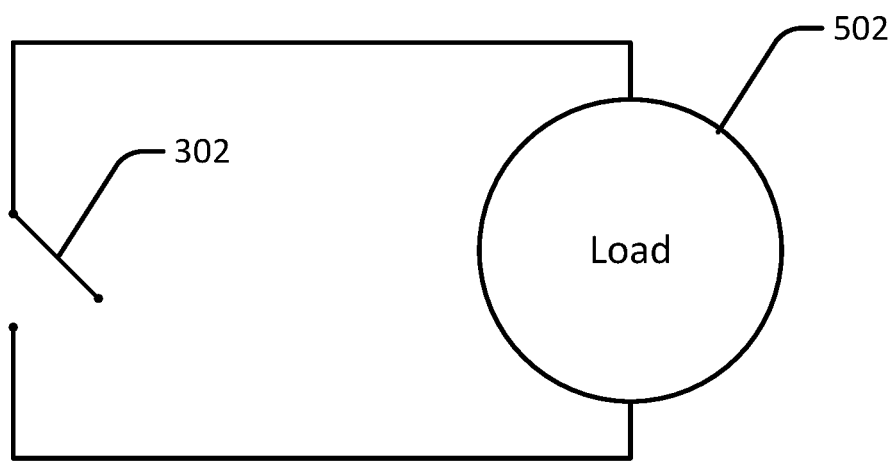
FIG. 5A illustrates an embodiment of the switch of FIG. 3.

In some embodiments, such as that shown in FIG. 5A, an electrical damping load 502 is added in parallel with switch 302. Damping load 502 is added to damp any voltage spikes that may occur when switch 302 is toggled to the non-conductive open-state by providing an alternative circuit through which electric current can flow. In practice, damping load 502 may be embodied in the other electrodes in cell 101. In which case damping load 502 is not localised to any particular switch 302 of cell 101.

Figure 5B:
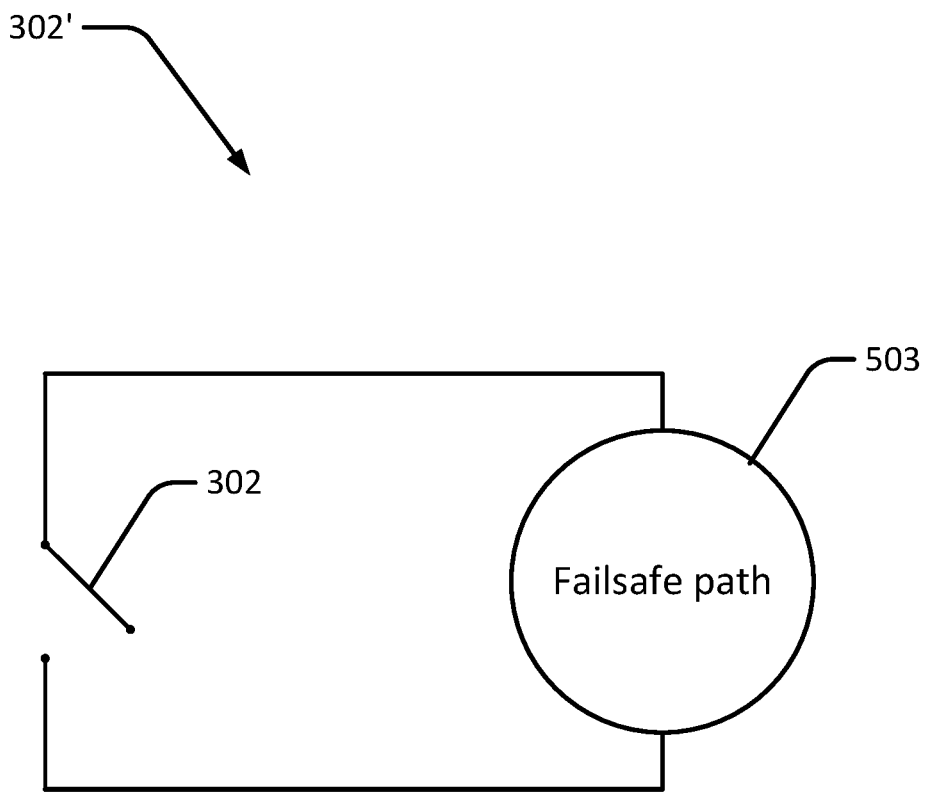
FIG. 5B illustrates an embodiment of the switch of FIG. 3.

FIG. 5B illustrates a switch 302', which comprises switch 302 with a failsafe path 503 conducting in parallel to switch 302. Failsafe path 503 provides an electrical path around switch 302 in the event that switch 302 moves to the non-conductive open state due to a loss of power.

Figure 5C:
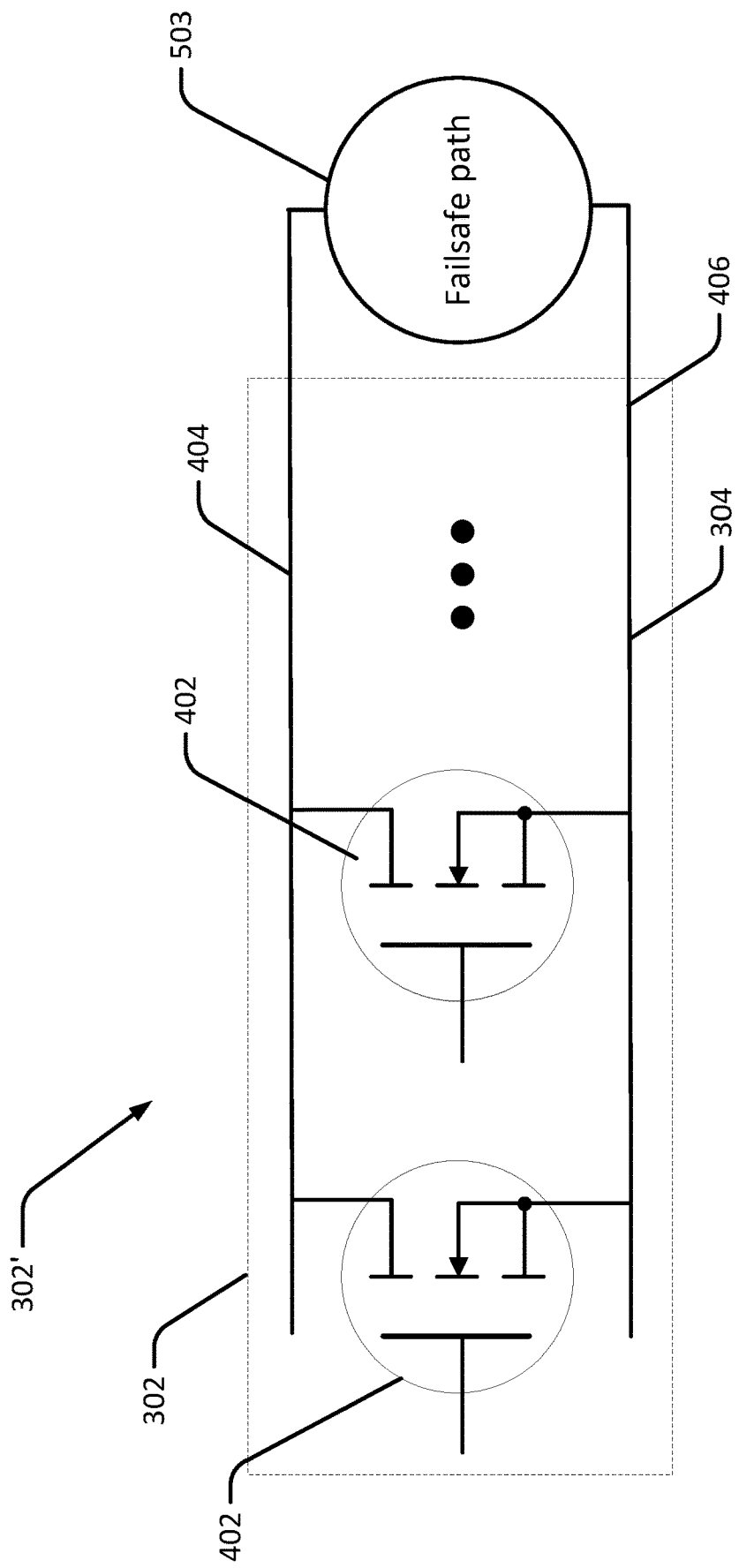
FIG. 5C illustrates an embodiment of the switch of FIG. 3.

For example, a specific embodiment of switch 302' is shown in FIG. 5C where switch 302 comprises a plurality of parallel MOSFETs 402. In use in cell 101, each cathode 106 of cell 101 will be connected to inter-cell busbar 102 by a switch 302', as shown for a single cathode in FIG. 3. In a situation where power to cell 101 is available, but power to the gate electrodes of MOSFETs 402 is lost, each switch 302 will become non-conductive. However, even without power to the gate electrodes of MOSFETs 402, switch 302' will still conduct electrical current through failsafe path 503. The continued conduction through failsafe path 503 prevents excessive voltage spikes from occurring in cell 101 thereby reducing risks of fire, explosion, damage to equipment or electrocution of nearby people. A further advantage of this embodiment is that productivity of cell 101 can be maintained even if power to switches 302' is lost.

Failsafe path 503 is a higher resistance path than switch 302. So, under normal conditions where switch 302 is in the conductive closed state, most of the electrical current flowing through switch 302' will flow through switch 302 and comparatively little electrical current will flow through failsafe path 503. However, in the event where power to the gate electrodes of MOSFETs 402 is lost, switch 302 will become non-conductive and all of the electrical current through switch 302' will flow through failsafe path 503. It will be appreciated that failsafe path 503 can also act as a damping load 502.

Failsafe path 503 may be a conductor having an electrical resistance which is greater than the electrical resistance of switch 302 in its closed conducting state thus ensuring that the majority of current flows through switch 302 when in its closed conducting state. Furthermore, the electrical resistance of failsafe path 503 should be low enough to prevent thermal runaway for at least a predetermined period of time when switch 302 is in its open non-conducting state. For example, the predetermined period of time may be long enough to shut down the power to cell 101.

In another embodiment, failsafe path 503 may be an appropriately oriented diode or rectifier. In this embodiment, the voltage drop across switch 302' is below the forward voltage of the diode/rectifier when switch 302 is in its closed conducting state. Accordingly, no current will flow through failsafe path 503. However, when switch 302 is in its open non-conductive state due to a loss of power to the gate electrodes, the voltage drop across switch 302', and therefore failsafe path 503, will exceed the forward voltage of the diode/rectifier of failsafe path 503. Accordingly, all current flowing through switch 302' will be flowing through failsafe path 503, thereby allowing continued operation of cell 101.

Due to a variance in switching times between individual MOSFET devices, it is typically taught that MOSFETs should not be connected in parallel. Devices which take longer to toggle from the closed conducting state to the open non-conducting state burn out due to excess current and voltage being diverted through them. However, in the present application, damping load 502 and/or failsafe path 503 prevent this from occurring.

As before, when the onset and/or presence of short-circuits, a toggle signal 309 is sent to switch 302'. Toggle signal 309 causes switch 302 of switch 302' to toggle to the non-conductive open-state. The effects of the short circuit can then be mitigated as discussed below.

In some embodiments, switch 302 is integrally formed within cathode busbar 102 and/or anode busbar 104.

Multi-Mode Operation

In some embodiments, controller 306 is further configured to operate in a second mode of operation wherein the second mode of operation has a second threshold value. When operating in the second mode of operation, controller 306 monitors electric current 308 through switch 302 and generates a toggle signal 309 when current 308 exceeds the second threshold value. Toggle signal 309 toggles switch 302 from a conductive closed state to a shown non-conductive open state as indicated by arrow 310.

In certain embodiments, controller 306 is configured to generate the toggle signal when electric current 308 exceeds the first or second threshold value for a predetermined time. The predetermined time is set greater than a time period for transient currents which would be a false indicator of a short-circuit. It will be appreciated that the exact value is application specific but is typically 100 milliseconds.

Whether controller 306 operates in the first or second mode depends on several factors, as discussed in more detail below.

To harvest metal deposited on electrodes, the electrodes need to be removed from the electrolytic cell. Typically, one third of cathode electrodes are removed at a time for this purpose. When these electrodes are removed for harvesting purposes, the electric current to the remaining electrodes increases, even in the absence of a short-circuit. The second threshold value is an electric current magnitude indicative of a short-circuit in electrolytic cell 100 or 101 during this harvest time. The exact value of the second threshold current will be application specific and will also depend on the number of electrodes removed for harvesting at a time. In some embodiments, the second threshold is a predetermined second multiple of the normal operating current. For the typical case where one third of electrodes are removed for harvesting, the predetermined second multiple is two and a half times the normal operating current. For example if the normal operating current is 620 amperes, the second threshold current will be about 1550 amperes.

In some embodiments, controller 306 is configured to self-calibrate and determine an appropriate normal operating current thereby to determine the first and/or second threshold. The self-calibration process is described below.

Similarly, when electrodes are isolated or disconnected due to a short-circuit as described above, the electric current to the remaining electrodes increases, even in the absence of any other short-circuits.

In some embodiments, controller 306 is configured to adopt a mode of operation in response to a received configuration signal. For example the received configuration signal may be initiated manually by a worker and/or automatically based on an operation timer. In this embodiment, controller 306 operates in the first mode during scheduled normal operation and in the second mode during scheduled harvesting.

Figure 6:
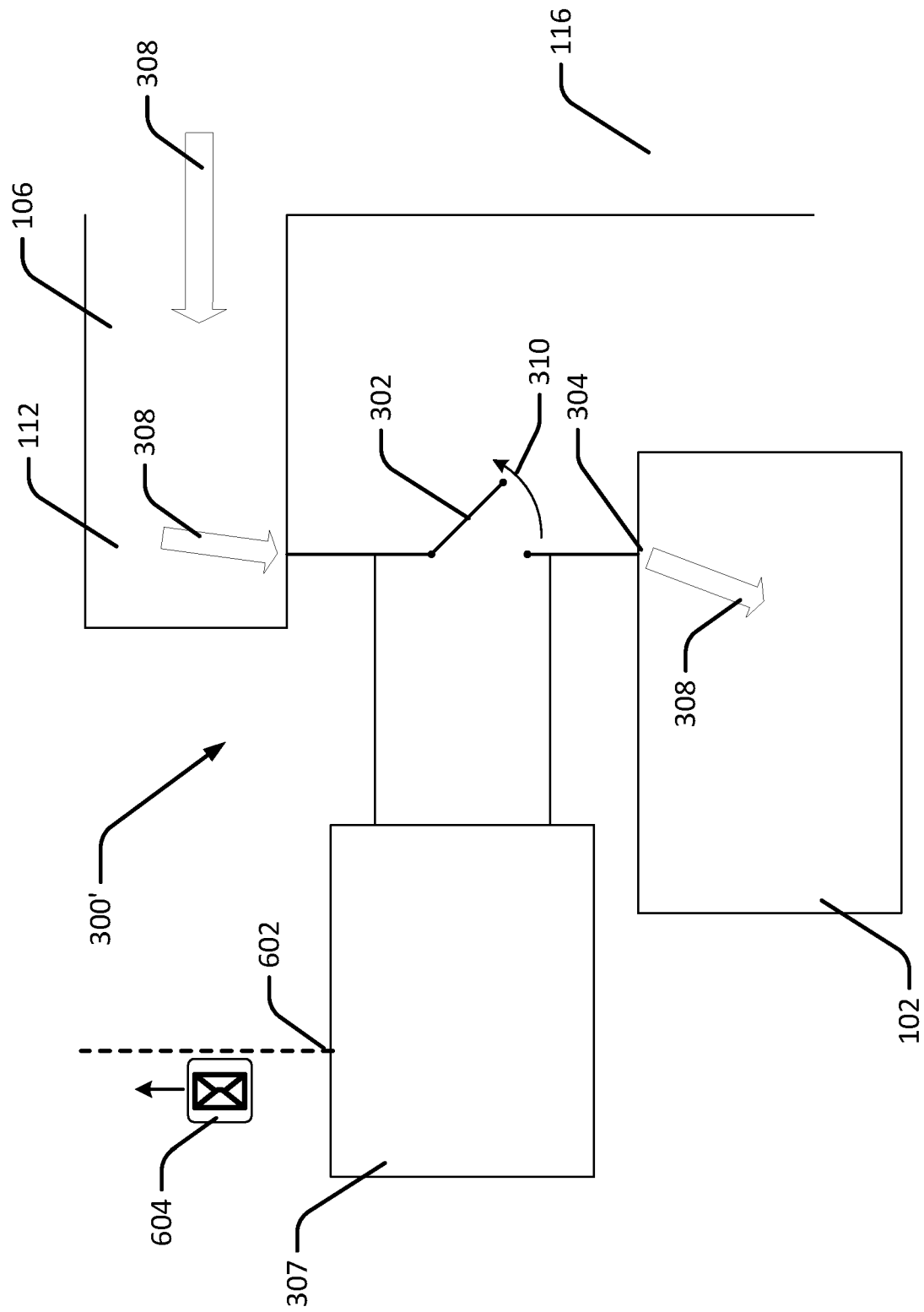
FIG. 6 is a schematic representation of a short-circuit mitigation device.

In the embodiment illustrated in FIG. 6, controller 307 of device 300' is similar to controller 306 but includes a transmission port 602 and is configured to transmit data 604. Data 604 includes data indicative of the magnitude of electric current 308, temperature and/or state data indicative of the state of switch 302. The state data is indicative of whether switch 302 is currently in the conductive closed state or the non-conductive open state.

Although data port 602 is illustrated as a hard wired connection, the disclosure is not intended to be limited by this. In practice, data port 602 may be a wireless transmitter, one or more optical indicators such as LEDs or any other suitable means of conveying data 604.

For example, in the situation where switch 302, whether alone or as part of switch 302', is toggled to the non-conductive open state, a signal indicating the state change may be transmitted to a central control station. In response to the signal, a worker may be dispatched to mitigate the effects of the short-circuit.

In some embodiments, data 604 is used to identify low or no current conditions, which occur as a result of contamination and/or scale build-up on electrical contact 304 and/or support wings 112 and/or 114. For example, on detecting the low-current condition, an LED may be energized to indicate that scale has built up on the associated electrical contact and/or support wing. In response to the LED signal, a worker may be dispatched to mitigate the scale. Typically, low-current conditions are considered to be 70% or less of the normal operating current.

Figure 7:
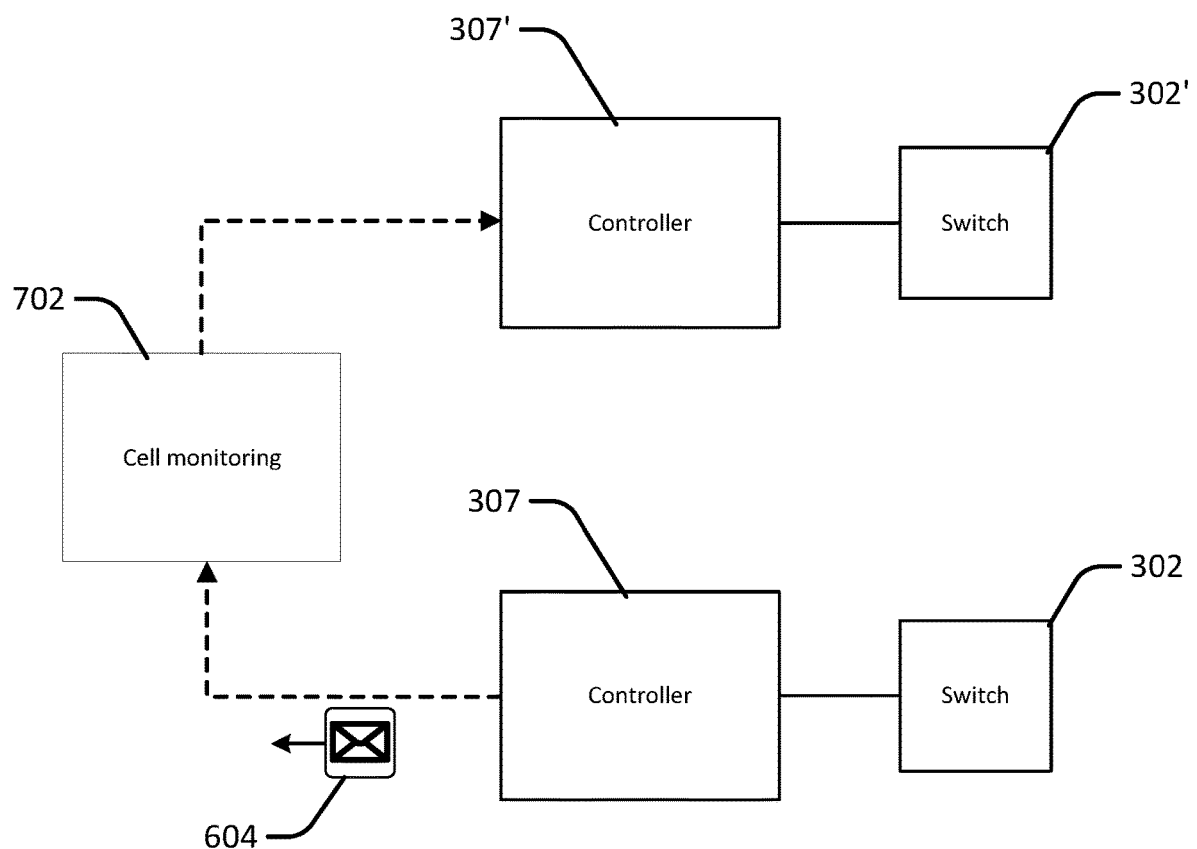
FIG. 7 is a schematic representation of a system having two short-circuit mitigation devices.

In some embodiments, such as that shown in FIG. 7, the configuration signal is state data received from a second controller. The state data is routed through a cell monitoring system 702. In this example, the electric current through switch 302 or 302' has exceeded a threshold and hence controller 307 has generated a toggle signal to toggle switch 302 from the conductive closed state to the non-conductive open state. State data 604, transmitted from controller 307 indicating the open state of switch 302, whether alone or as part of switch 302', is received by controller 307' associated with switch 302'. In response to receiving state data 604, controller 307' adopts the second mode of operation. In some embodiments, controller 307 communicates directly with controller 307' without the use of cell monitoring system 702.

Figure 8:
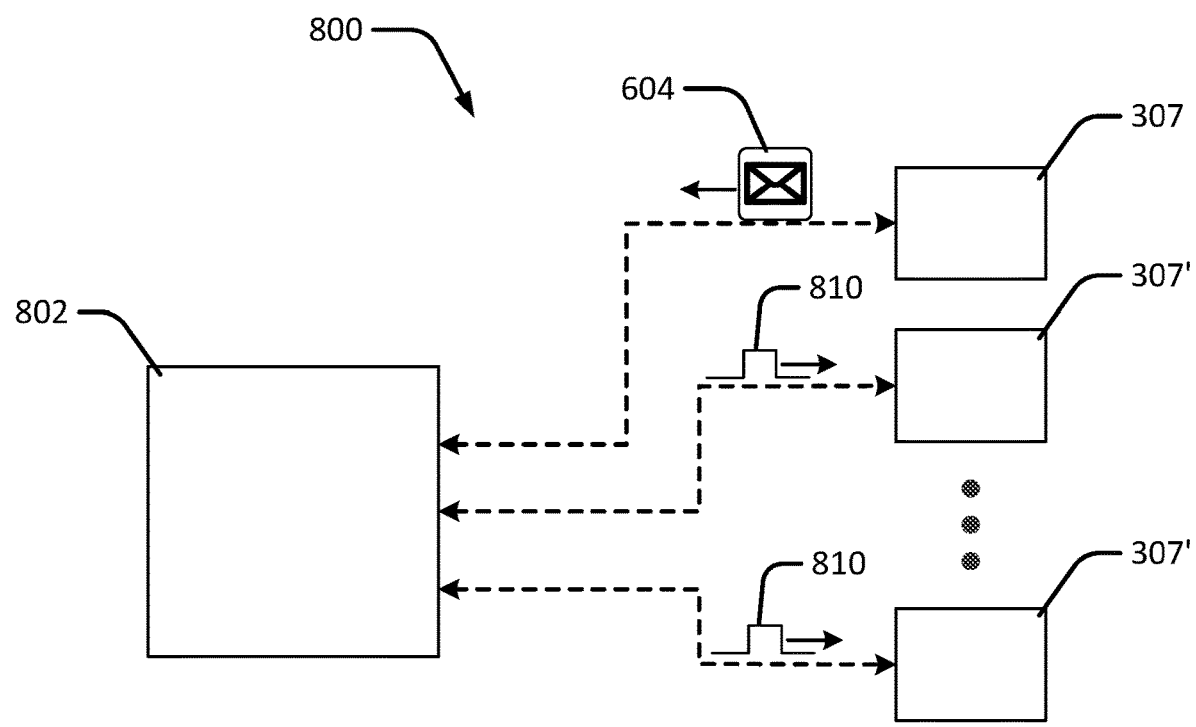
FIG. 8 is a schematic representation of a system having a plurality of short-circuit mitigation devices.

In the embodiment of FIG. 8, system 800 comprises a plurality of devices 300 represented by controllers 307 and 307'. System 800 further comprises a cell controller 802 in two-way communication with each of controllers 307 and 307'. Cell controller 802 monitors the plurality of controllers and provides appropriate configuration signals to them. For example, controller 307 has generated a toggle signal to toggle the associated switch (not shown) to the non-conductive open state. Controller 307 then indicates the change of state of the associated switch by transmitting state data 604 to cell controller 802. Cell controller 802 then transmits configuration signals 810 to the other controllers 307' such that controllers 307' adopt the second mode of operation.

In practice, cell controller 802 will only transmit configuration signals 810 when state data indicating a non-conductive open state has been received from a threshold number of controllers 307 or during a harvest event. The threshold number will depend on the number of electrodes in electrolytic cell 101.

In some embodiments, cell controller 802 is configured to receive and monitor data indicative of electric current 308 from each of controllers 307 and 307'. Controller 802 uses the data indicative of the electric current to establish the normal operating current and thereby determine the first and second threshold values.

In some embodiments, cell controller 802 automatically detects harvest events. A harvest event may be detected when data 604, received from a predetermined number of controllers 307, indicates no appreciable current 308 in the associated switches. For example, during a harvest event, ⅓ of controllers 307 will provide data 604 indicating no appreciable current 308 through the associated switches. In other embodiments, other ratios are used to detect harvest events.

Figure 9:
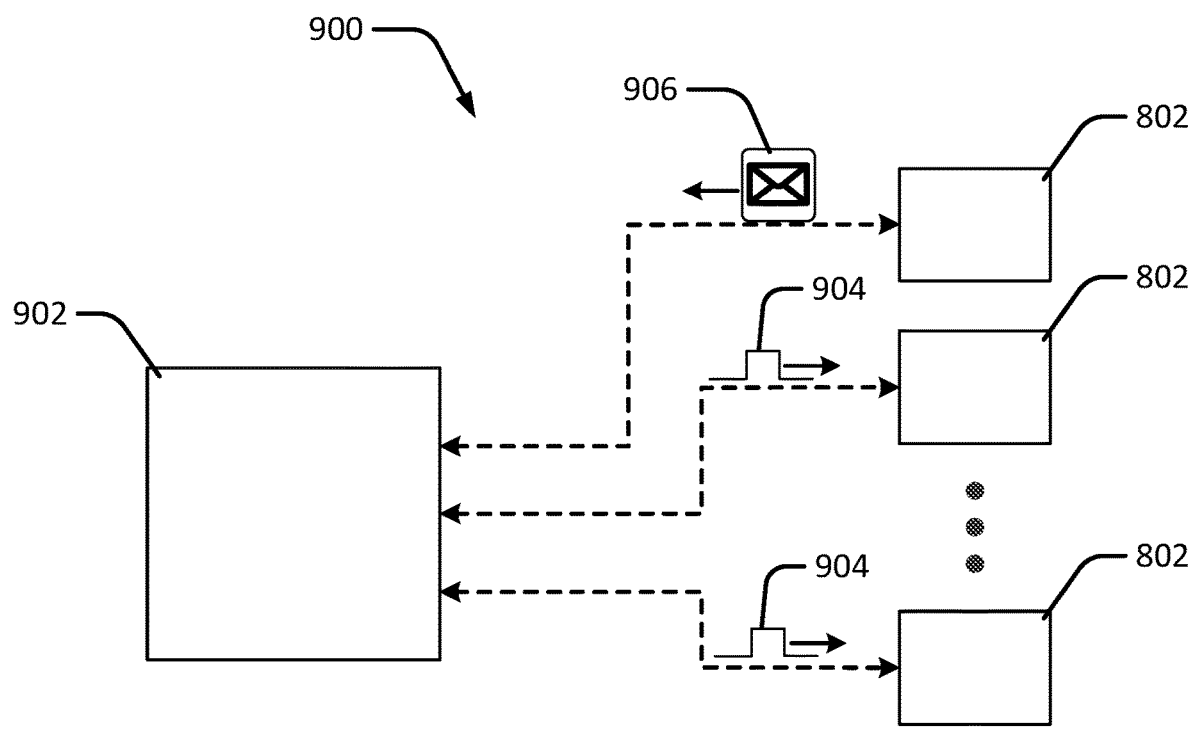
FIG. 9 is a schematic representation of a system having a plurality of short-circuit mitigation devices.

In the embodiment of FIG. 9, system 900 comprises a plant controller 902 and a plurality of cell controllers 802. Each cell controller 802 is in communication with a plurality of switch controllers as shown in FIG. 8. Plant controller 902 receives operating data 906 comprising electric current information, temperature, voltage potential/distribution and/or state data from each of the cell controllers 802. It will be appreciated that operating data 906 allows plant controller 902 to monitor the operation of each cell.

In some embodiments, plant controller 902 is further configured to provide cell configuration data 904 to cell controllers 802 to control or adjust threshold values and modes of operation.

As mentioned above, threshold values are established as a fixed multiple of normal operating currents. Plant controller 902 utilises operating data 906 received from each of the cell controllers 802 to establish a value for normal operating current. Once the normal operating current is established, controller 902 transmits the threshold values to each cell controller 802 in cell configuration data 904. Note that although system 900 is illustrated with only one cell controller providing operating data 906, in practice all cell controllers 802 will provide operating data. Similarly, configuration data will be provided to all cell controllers 802.

In some embodiments, plant controller 902 is also configured to provide harvesting information to cell controllers 802, indicating harvest events. The harvesting information allows cell controllers 802 to operate in the appropriate mode of operation. The harvesting information may be based on a predetermined schedule, manually triggered by a worker or automatically detected by controller 902 based on data received from controllers 802. A harvest event is automatically detected when operating data 906 indicates that a predetermined number of controllers 307 in a given cell are measuring no appreciable current 308. For example, during a harvest event, ⅓ of controllers 307 will provide state data to cell controller 802 indicating that no appreciable current 308 is flowing through the associated switches. In other embodiments, other ratios are used to detect harvest events.

In some embodiments, controller 306 or 307 is configured to 'choke' the current by controlling the time averaged current through switch 302. A first method involves a pulse-width modulation of the current in which controller 306 or 307 generates a signal to toggle the switch between the open state for an open time period and the closed state for a closed time period. The time averaged current is then determined by the relative open and closed time periods.

A further method for choking the current involves controlling the conductivity of the switch. For example, if switch 302, whether alone or as part of switch 302', comprises one or more MOSFET devices, controller 306 or 307 can operate the MOSFET/s in the linear region where the conductivity is roughly linearly dependent on the gate voltage of the MOSFET. In this region, the conductivity of switch 302 can be increased by increasing the gate voltage and the conductivity of switch 302 can be decreased by decreasing the gate voltage. It will be appreciated that by controlling the conductivity of switch 302 that current 308 can also be controlled.

In further embodiments, controller 306 or 307 is configured to adopt a low power state at predetermined times. In the low power state, controller 306 or 307 does not monitor current 308 through switch 302. Thus controller 306 or 307 essentially cycles between a powered state in which normal operation as discussed above occurs, and the low power state in which no current monitoring occurs. The cycling reduces the power consumed by device 300 or 300'.

In an embodiment, controller 306 or 307 is configured to generate a reset signal to toggle the switch from the non-conductive open state to the conductive closed state. The reset signal is generated in response to instructions received in reconfiguration signal 810 from cell controller 802. Cell controller 802 may generate these instructions in response to receiving instructions in cell configuration data 904 from plant controller 902, from a signal manually triggered by a worker, or based on lapsed time from the previous toggle signal toggling the switch from the conductive closed state to the non-conductive open state.

Figure 10:
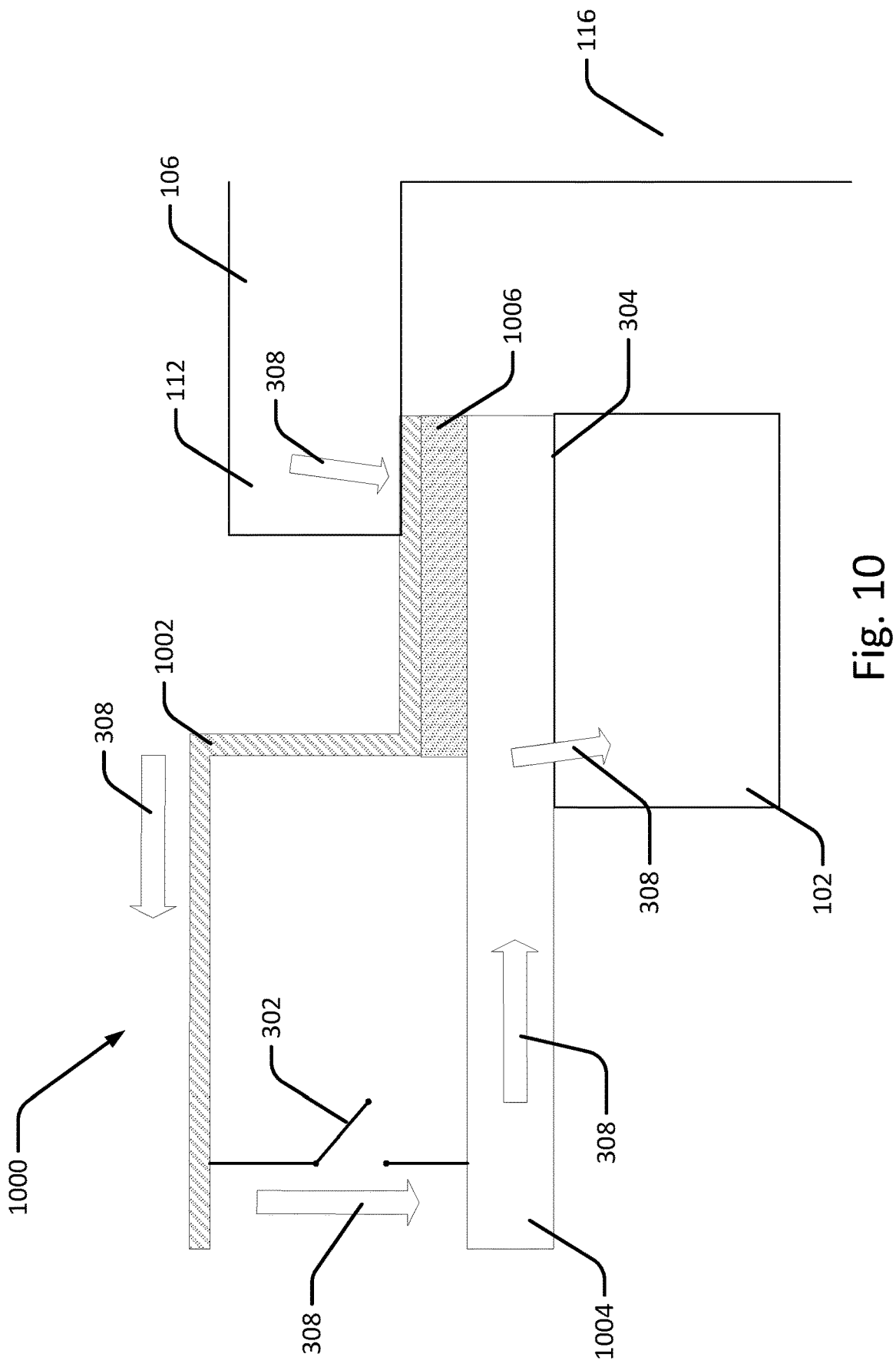
FIG. 10 illustrates an embodiment of the switch of FIG. 3.

A further embodiment is shown schematically as device 1000 in FIG. 10. Device 1000 includes short-circuit mitigation device 300 or 300' represented here by switch 302, described above and a top contact 1002 to support electrode 116 of plate 106 through support wing 112. A bottom contact 1004 rests on electrical contact 304 of cathode busbar 102 and is separated from top contact 1002 by an electrically insulating layer 1006. Switch 302 electrically connects top layer 1002 to bottom layer 1004 when in the conductive closed state such that current 308 flows from electrode 116, through top contact 1002, through switch 302 of device 300 or 300', through bottom contact 1004 and into cathode busbar 102.

Device 1000 allows device 300 or 300' to be horizontally displaced from support wing 112 and cathode busbar 102. Horizontal displacement facilitates retrofitting of device 300 or 300' to existing electrolytic cells and has the further benefits of promoting heat dissipation from switch 302 and preventing potential impact damage to switch 302 when electrode 116 is placed into cell 101.

In some embodiments electrically insulating layer 1006 is an air gap while in other embodiments layer 1006 is a solid insulating material such as a polymeric/refractory material.

Figure 11:
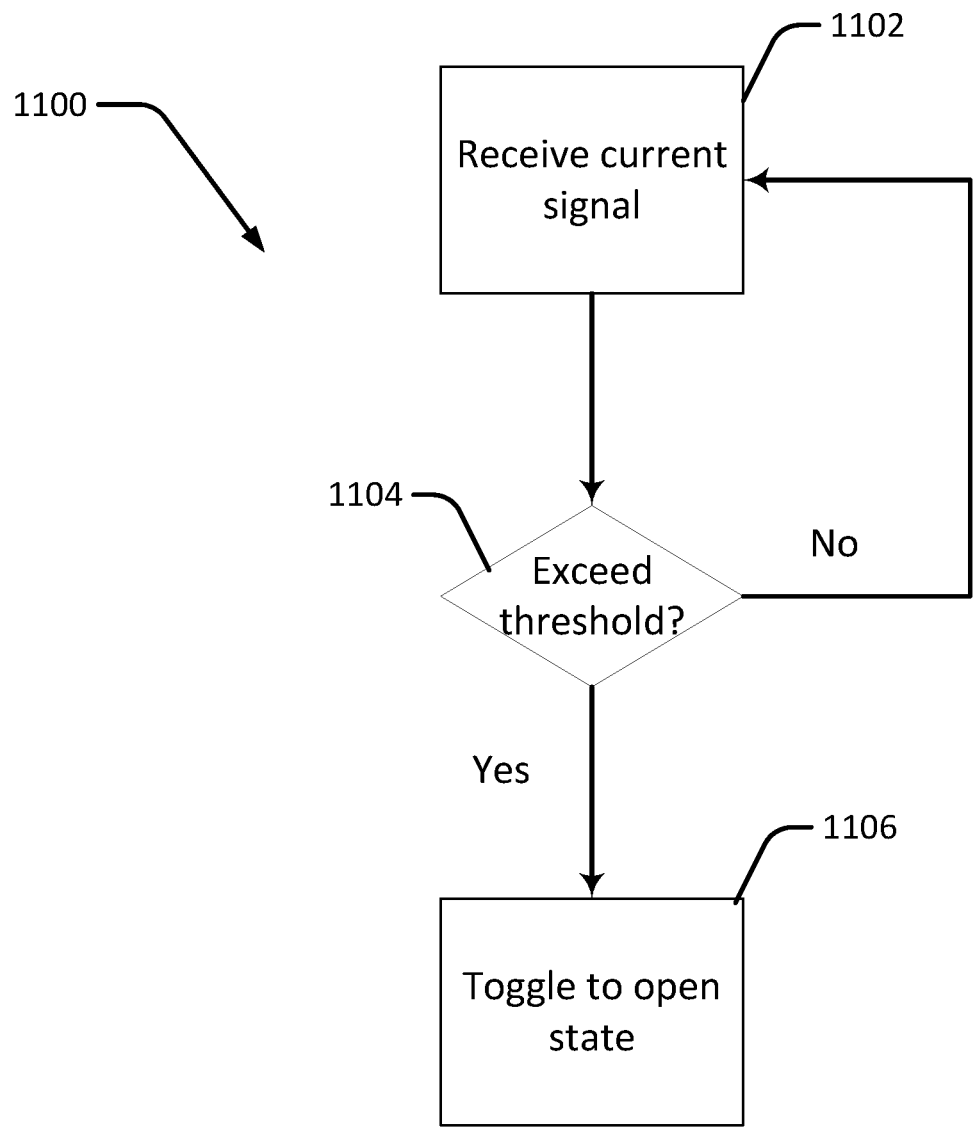
FIG. 11 illustrates a method performed by a switch controller.

FIG. 11 illustrates a method 1100 performed by controller 306 or 307 of device 300 or 300'. At step 1102, controller 306 or 307 receives a current signal indicative of electric current 308. Current 308 is then compared to a predetermined threshold at step 1104. If current 308 exceeds the threshold value, controller 306 or 307 performs step 1106, generating toggle signal 309 to toggle switch 302 from a conductive closed state to a non-conductive open state. If current 308 does not exceed the threshold value then the controller 306 or 307 repeats method 1100 from step 1102 and continues to receive the current signal.

Figure 12:
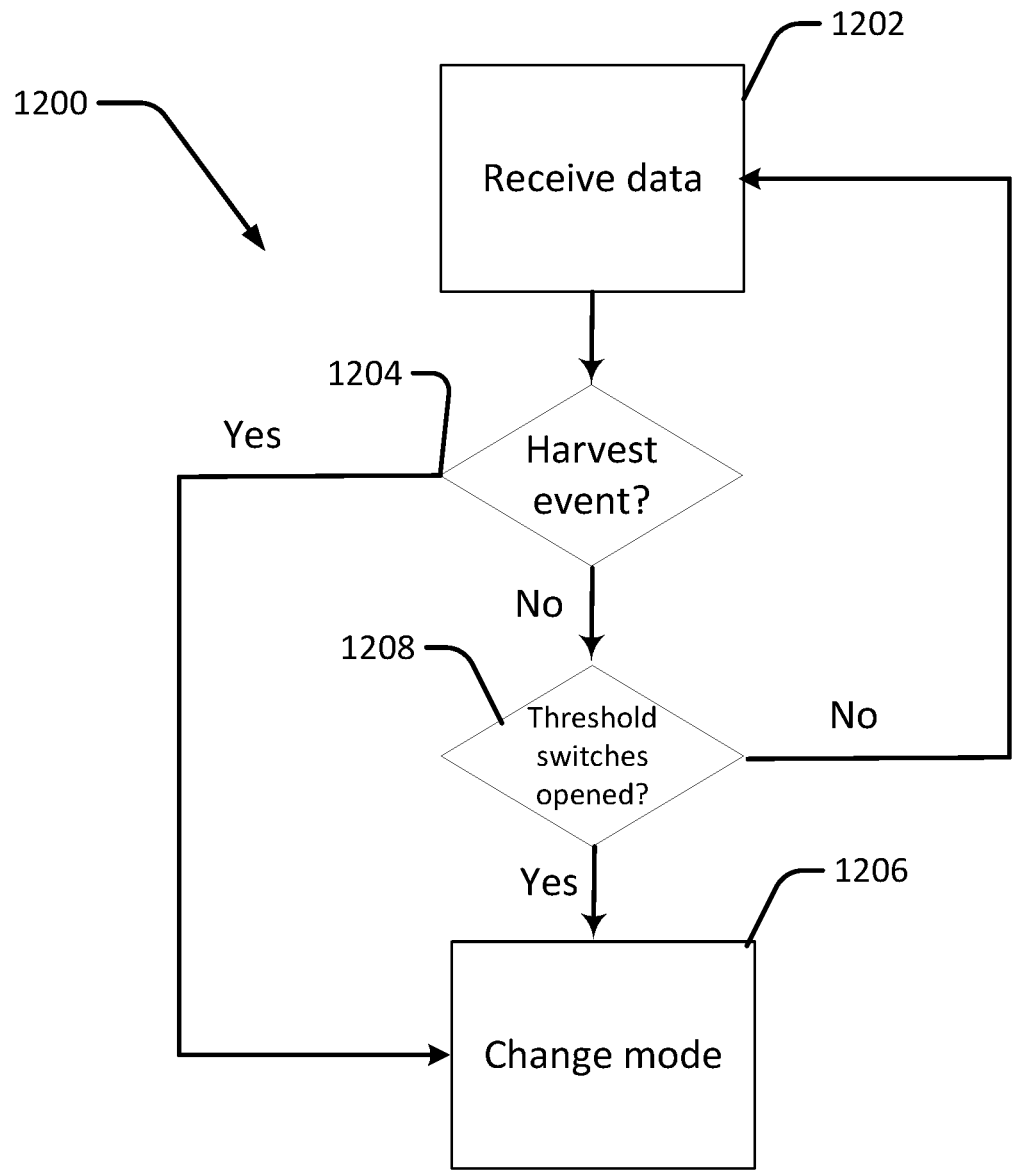
FIG. 12 illustrates an exemplary method performed by a cell controller.

FIG. 12 illustrates a method 1200 performed by cell controller 802. Cell controller 802 receives data at step 1202. This data may be toggle data 604 indicating that controller 307 has toggled its associated switch to a non-conductive open state or it may be cell configuration data 904.

The received data is then analysed at step 1204 to determine whether it indicates a harvest event is occurring. If a harvest event is occurring, step 1206 is initiated, wherein configuration signal 810 is transmitted to controllers 307.

If the data does not indicate a harvest event, the data is analysed at step 1208 to determine whether a switch has been toggled, and, if so, whether the threshold number of switches has been toggled to the non-conductive open state. If the threshold number of switches have been toggled to the non-conductive open state, step 1206 is initiated wherein configuration signal 810 is transmitted to controllers 307. If the threshold number has not been toggled to the non-conductive open state, cell controller 802 reverts to step 1202 and continues to receive data.

Self-Calibration of Controllers

In certain embodiments, controllers 306 and 307, cell controller 802 and plant controller 902 can be configured to self-calibrate by determining the normal operating current.

The self-calibration process comprises recording and/or accessing historic electric current data from non-harvest periods. If the statistical variance of the historic electric current data is below a predetermined threshold, then the normal operating current is determined to be the statistical mean of the historic electric current data. If the statistical variance of the historic electric current data is above the predetermined threshold then the controller continues to record electric current data until the variance is below the threshold. If the variance has not reduced below the threshold within a calibration time period it is an indication of unstable operation. In this case, an error is signalled to a human operator to investigate the source of the unstable current.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A short-circuit mitigation device for use in an electrolytic cell having an electrical contact and an electrode, the device comprising:
   a switch connected in parallel with a damping load and disposed between the contact and the electrode, the switch configured to selectively provide an electrical conduction path between the contact and the electrode, wherein the switch comprises a plurality of metal-oxide-semiconductor field-effect transistors (MOSFETs) connected in parallel;
   a conductive failsafe path connected in parallel with the MOSFETs to provide an electrical path around the switch; and
   a switch controller operably associated with the switch to monitor electric current through the switch and to generate a toggle signal to toggle the switch from a conductive closed state to a non-conductive open state when the electric current exceeds a first threshold value.

2. The device of claim 1 wherein the failsafe path includes a conductor having an electrical resistance greater than the electrical resistance of the plurality of MOSFETS in its closed conducting state.

3. The device of claim 1 wherein the controller is further configured to operate in at least a first mode of operation and a second mode of operation wherein the first mode of operation has a first threshold value and the second mode of operation has a second threshold value.

4. The device according to claim 1 wherein the controller is configured to generate the toggle signal when the electric current through the switch exceeds the first or second threshold value for a predetermined period of time.

5. The device according to claim 1 wherein the controller is configured to transmit data indicative of the electric current.

6. The device according to claim 1 wherein the controller is configured to transmit state data indicative of the state of the switch.

7. The device according to claim 1 wherein the controller is configured to adopt a mode of operation in response to a received configuration signal.

8. The device according to claim 7 wherein the configuration signal is state data received from a second controller of a second device according to claim 6.

9. The device according to claim 7 wherein the configuration signal is received from a cell controller.

10. The device according to claim 9 wherein the cell controller is in two way communication with a plurality of controllers and generates the configuration signal in response to state data respectively received from each of the plurality of controllers.

11. The device according to claim 1 wherein the controller is configured to adopt a low power state at predetermined times such that in the low power state the controller does not monitor the electric current through the switch.

12. The device according to claim 1 wherein the controller is configured to generate a reset signal to toggle the switch from the non-conductive open state to the conductive closed state.

13. The device according to claim 1 wherein the controller is configured to control the time averaged current through the switch.

14. The device according to claim 13 wherein the controller is configured to control the time averaged current through the switch by cyclically generating a further signal to toggle the switch between the non-conductive open state for an open time period and the conductive closed state for a closed time period such that the time averaged current is determined by the relative open and closed time periods.

15. The device of claim 1 comprising:
a top contact to support the electrode;
a bottom contact to rest on the electrical contact and separated from the top contact by an electrically insulating layer;
wherein a first end of the switch electrically contacts the top contact and a second end of the switch electrically contacts the bottom contact and wherein the switch is displaced from the top and bottom contacts.

16. The device according to claim 1 wherein the electrolytic cell is an electrowinning cell or an electrorefining cell or an electrodeposition cell.

17. The device according to claim 1 wherein the first threshold current is a predetermined first multiple of a normal working current.

18. The device according to claim 3 wherein second threshold current is a predetermined second multiple of a normal working current.

19. The device according to claim 18 wherein the predetermined first multiple is from 1.5 to 3.

20. The device according to claim 18 wherein the second multiple is from 2 to 3.5.

21. A system comprising two or more devices according to claim 1 for mitigating a short-circuit in an electrolytic cell.

22. A method performed by a short-circuit mitigation device having a switch connected in parallel with a conductive failsafe path to provide an electrical path around the switch, the switch comprising a plurality of metal-oxide-semiconductor field-effect transistors (MOSFETs) connected in parallel and disposed between an electrical contact and an electrode in an electrolytic cell, the method comprising:
receiving a current signal indicative of an electrical current through the switch; and
generating a toggle signal to toggle the switch from a conductive closed state to a non-conductive open state when the current signal is indicative that the electric current exceeds a first or second threshold value.

* * * * *